US 6,666,371 B2

(12) United States Patent
Nakazawa et al.

(10) Patent No.: US 6,666,371 B2
(45) Date of Patent: Dec. 23, 2003

(54) SEALING SYSTEM FOR ELECTRONIC DEVICE AND SEALING METHOD THEREFOR

(75) Inventors: Tetsuji Nakazawa, Nagano (JP); Yuji Ikeda, Nagano (JP); Katsuhiko Takahashi, Nagano (JP)

(73) Assignee: Fujitsu Media Devices Limited, Nagano (JP)

( * ) Notice: Subject to any disclaimer, the term of this patent is extended or adjusted under 35 U.S.C. 154(b) by 14 days.

(21) Appl. No.: 10/046,757

(22) Filed: Jan. 17, 2002

(65) Prior Publication Data
US 2002/0175204 A1 Nov. 28, 2002

(30) Foreign Application Priority Data
May 22, 2001 (JP) ......................................... 2001-152421

(51) Int. Cl.[7] .......................... B32K 5/22; B32K 31/02; B32K 37/00
(52) U.S. Cl. ...................... 228/212; 228/47.1; 228/44.3
(58) Field of Search ............................... 228/47.1, 49.1, 228/49.2, 49.5, 6.1, 6.2, 44.3, 254, 124.6, 212, 44.7; 414/788–798.9, 147–216; 269/16, 37–45, 47–87.3

(56) References Cited

U.S. PATENT DOCUMENTS

| 4,558,812 A | * | 12/1985 | Bailey et al. ............ 228/180.1 |
| 4,602,417 A | * | 7/1986 | Mesch et al. .................. 29/564 |
| 4,907,999 A | * | 3/1990 | Sbordonne .................... 445/66 |
| 4,915,367 A | * | 4/1990 | Carossino ................... 269/101 |
| 5,090,609 A | * | 2/1992 | Nakao et al. ............ 228/123.1 |
| 5,148,962 A | * | 9/1992 | Jones et al. ................ 228/49.1 |
| 5,394,490 A | * | 2/1995 | Kato et al. ..................... 385/14 |
| 5,436,202 A | * | 7/1995 | Miura ........................ 228/102 |
| 6,092,713 A | * | 7/2000 | Kim ....................... 228/180.21 |
| 6,112,795 A | * | 9/2000 | Emmett et al. ............. 156/556 |
| 6,119,920 A | * | 9/2000 | Guthrie et al. ........... 228/123.1 |
| 6,352,195 B1 | * | 3/2002 | Guthrie et al. ........... 228/123.1 |
| 6,354,481 B1 | * | 3/2002 | Rich et al. ..................... 228/19 |
| 6,412,680 B1 | * | 7/2002 | Chua et al. ................... 228/6.2 |
| 6,489,586 B1 | * | 12/2002 | Corral ..................... 219/121.6 |

FOREIGN PATENT DOCUMENTS

| EP | 1 225 002 A1 | * | 7/2002 |
| JP | 09-122941 | * | 5/1997 |

* cited by examiner

Primary Examiner—Tom Dunn
Assistant Examiner—Colleen P. Cooke
(74) Attorney, Agent, or Firm—Arent Fox Kintner Plotkin & Kahn, PLLC

(57) ABSTRACT

The present invention provides a sealing system for implementing an optimum temperature profile for solder melting and improving productivity, and a sealing method therefor. The present invention comprises a sealing machine for superimposing a pre-soldered cap onto a package on which an electronic device element is mounted, a multi-clip for receiving and holding a plurality of sets of the packages and caps superimposed by the sealing machine in batch, and a sealing furnace for heating the plurality of sets held in batch by the multi-clip, and generating a plurality of electronic devices in batch by melting the previously applied solder and sealing the plurality of sets of packages and caps. According to the present invention, the plurality of sets of the packages and caps held in batch by the multi-clip are heated and sealed, therefore the sealing efficiency of the packages and caps can be improved.

13 Claims, 13 Drawing Sheets

SEALING SYSTEM FOR ELECTRONIC DEVICE AND SEALING METHOD THEREFOR

BACKGROUND OF THE INVENTION

1. Field of the Invention

The present invention relates to a sealing system for sealing a package on which an electronic device element is mounted, and a cap, and a sealing method therefor, and more particularly to a sealing system for sealing a package and a cap while securing them with a multi-clip, and a sealing method therefor.

2. Description of the Related Art

Recently in the electronic equipment field, electronic devices where such electronic device elements as an SAW (Surface Acoustic Wave) filter and a semiconductor chip are mounted on a box-shaped package, and the opening of the package is sealed by a cap, are manufactured to meet the demand for downsizing and decreasing price.

FIG. 13A is a cross-sectional view of such an electronic device 60. As FIG. 13A shows, an electronic device element 80 is mounted on a box-shaped package 81, and the electronic device 60 is configured by sealing the opening of the package 81 with the cap 82 with solder.

FIG. 13B is a diagram depicting a conventional sealing method. As FIG. 13B shows, the cap 82 with solder is superimposed on the package 81 on which the electronic device element 80 is mounted in the chamber 85, and heater electrodes 83 and 84 (surface temperature, about 500° C.) are contacted from the top and the bottom in a space filled with nitrogen gas, and the solder is melted by this heat for sealing. In this case, solder composed of gold-tin (Au-Sn) alloy, which eutectic point is 340° C., is used, for example.

Another sealing method is a sealing method by seam welding. In this method, a cap 82 is covered on a package 81 where a seal ring is attached, electric current is supplied to the contact face between the package 81 and the cap 82 by a roller electrode, and the cap 82 is sealed by welding.

However, with the conventional sealing method using the heater electrodes 83 and 84, the temperature of the package 81 rapidly rises, and the package 81 may crack due to heat shock, which drops the reliability of the electronic device 60. Also the set temperature of the heater electrodes 83 and 84 is high, which wears out the heater electrodes 83 and 84 considerably, and maintenance for this makes it difficult to improve productivity.

In the case of the conventional sealing method using the heater electrodes 83 and 84, it is also difficult to select an appropriate temperature profile for melting the solder, and therefore, the change of the eutectic point due to a subtle change of the gold-tin (Au-Sn) alloy solder components cannot be appropriately responded.

In the case of the sealing method by seam welding, on the other hand, strain at four corners of an electronic device is large when this method is applied to a small-sized electronic device 60, which may drop the air tightness quality of the electronic device 60.

SUMMARY OF THE INVENTION

With the foregoing in view, it is an object of the present invention to provide a sealing system and sealing method therefor which implement an optimum temperature profile for solder melting, and which can improve productivity.

To achieve the above object, one aspect of the present invention comprises a sealing machine for superimposing a pre-soldered cap onto the opening of a package on which an electronic device element is mounted, a multi-clip for receiving and holding a plurality of sets of the packages and caps superimposed by the sealing machine in batch, and a sealing furnace for heating the plurality of sets of the packages and caps held in batch by the multi-clip, and generating a plurality of electronic devices in batch by melting the previously applied solder and sealing the plurality of sets of the packages and caps.

According to the present invention, the plurality of sets of the packages and caps which are held in batch by the multi-clip are heated and sealed, so the sealing efficiency of the packages and caps can be improved.

Also an optimum temperature profile for melting the solder can be used in the sealing furnace, so the thermal stress on a package can be decreased, and the air tightness quality of the electronic device can be improved.

In the above-mentioned invention, it is preferable that the sealing machine further comprises a package supply block for storing a plurality of the packages, a cap supply block for storing a plurality of the caps, a cap loading stage for superimposing the caps supplied from the cap supply block onto the openings of the packages supplied from the package supply block, and a clip transporting block for transporting the plurality of sets of the packages and caps held in batch by the multi-clip to the sealing furnace.

Also preferably, the sealing machine further comprises a rotary table on which a plurality of the cap loading stages are set, and in each of the cap loading stages, the packages are supplied at a first rotational position of the rotary table, the caps are supplied at a second rotational position of the rotary table, and the plurality of sets of the superimposed packages and caps are supplied to the clip transporting block at a third rotational position of the rotary table.

Also preferably, the sealing system further comprises a clip tray on which a plurality of the multi-clips can be aligned, and the clip transporting block aligns the multi-clips holding the plurality of sets of packages and caps on the clip tray, and transports the multi-clips to the sealing furnace.

Also preferably, the clip tray has a plurality of protrusions for aligning the multi-clips, and the multi-clips have set holes where the protrusions are to be inserted.

According to the present invention, the multi-clips can be accurately aligned on the clip tray by inserting the protrusions formed on the clip tray into the set holes formed on the multi-clips, so the temperature conditions in the sealing furnace can be made uniform, and the air tightness quality of an electronic device can be improved.

To achieve the above object, another aspect of the present invention is a clip for holding superimposed packages and caps in a sealing system, comprising a receiver that can contact with a plurality of sets of the superimposed packages and caps on a same plane, a shaft secured to the receiver, a plurality of pressers which can rotate around this shaft, and an elastic body which applies an independent rotational driving force to the plurality of pressers, wherein the receiver and the plurality of pressers can hold the plurality of sets of the superimposed packages and caps independently by the independent rotational driving force.

According to the present invention, the plurality of sets of the packages and caps held by the multi-clip can be heated and sealed in batch, so the sealing efficiency of the packages and caps can be improved.

In the above invention, it is preferable that stoppers which are attached to the pressers for restricting the rotational angle of the pressers, are included in the present invention.

According to the present invention, the tips of the pressers do not become lower than a specific height even if the multi-clip is not holding the packages and caps, so a collision of the tips of the pressers with the laser imprinting stage can be prevented even if the multi-clip approaches the laser imprinting stage without holding the packages and caps, and the rubbing of the tips of the pressers against the surface of the cap loading stage can be prevented even if the multi-clip moves away from the cap loading stage without holding the packages and caps.

In the above invention, it is preferable that the pressers are made of a thin plate with a rib structure.

According to the present invention, the strength of the multi-clip can be maintained and warping or deformation can be prevented by the rib structure, so the plate thickness of the multi-clip can be decreased, and the heat capacity of the multi-clip can be decreased so as to drop heat loss in the sealing furnace.

DESCRIPTION OF THE PREFERRED EMBODIMENTS

Figure 1:
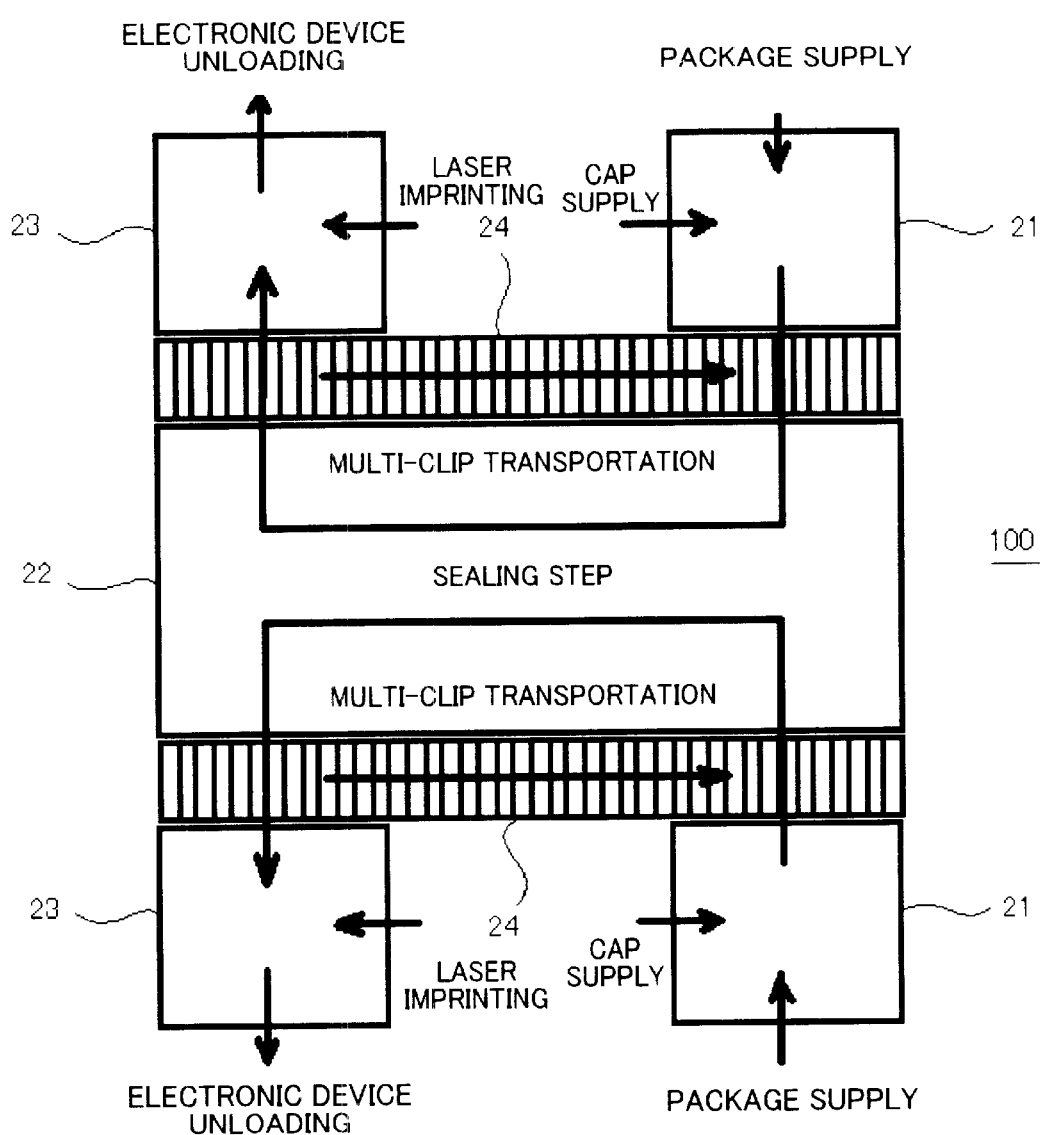
FIG. 1 is a plan view of a sealing system of an embodiment of the present invention.

Embodiments of the present invention will now be described with reference to the accompanying drawings. However, such embodiments shall not restrict the technical scope of the present invention. In the drawings, components having identical functions may be denoted by the same numbers.

FIG. 1 is a plan view depicting a sealing system of an embodiment of the present invention viewed from the top. The sealing system 100 of the present embodiment comprises a sealing machine 21 where packages on which electronic device elements are mounted and caps to be covers thereof are supplied, and the supplied packages and caps are superimposed, a sealing furnace 22 for sealing such superimposed packages and caps, a laser imprinting machine 23 for imprinting the sealed electronic devices by laser, and a return conveyer 24 for returning the later-mentioned multi-clip from the laser imprinting machine 23 to the sealing machine 21. FIG. 1 shows an example where two lines of the sealing machines 21, the laser imprinting machines 23 and the return conveyers 24, are installed, however only one line can also be installed.

Figure 13A:
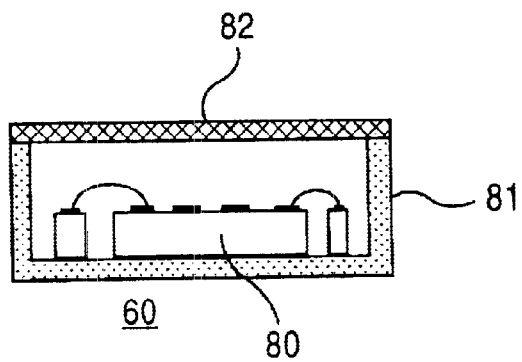
FIG. 13A is a cross-sectional view of an electronic device.
Figure 13B:
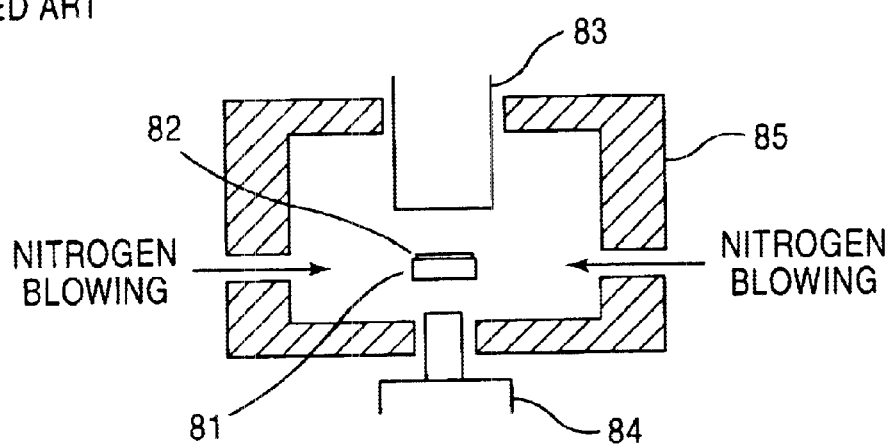
FIG. 13B is a diagram depicting a conventional sealing method.

Now the processing steps of the sealing system of an embodiment of the present invention will be described with reference to the flow chart shown in FIG. 2. In the sealing processing of the present embodiment, the packages 81 on which the electronic device elements 80 are mounted and the caps 82 to be covers thereof, shown in FIG. 13A, are stored in the sealing machine 21 (Steps S1 and S2).

Figure 3:
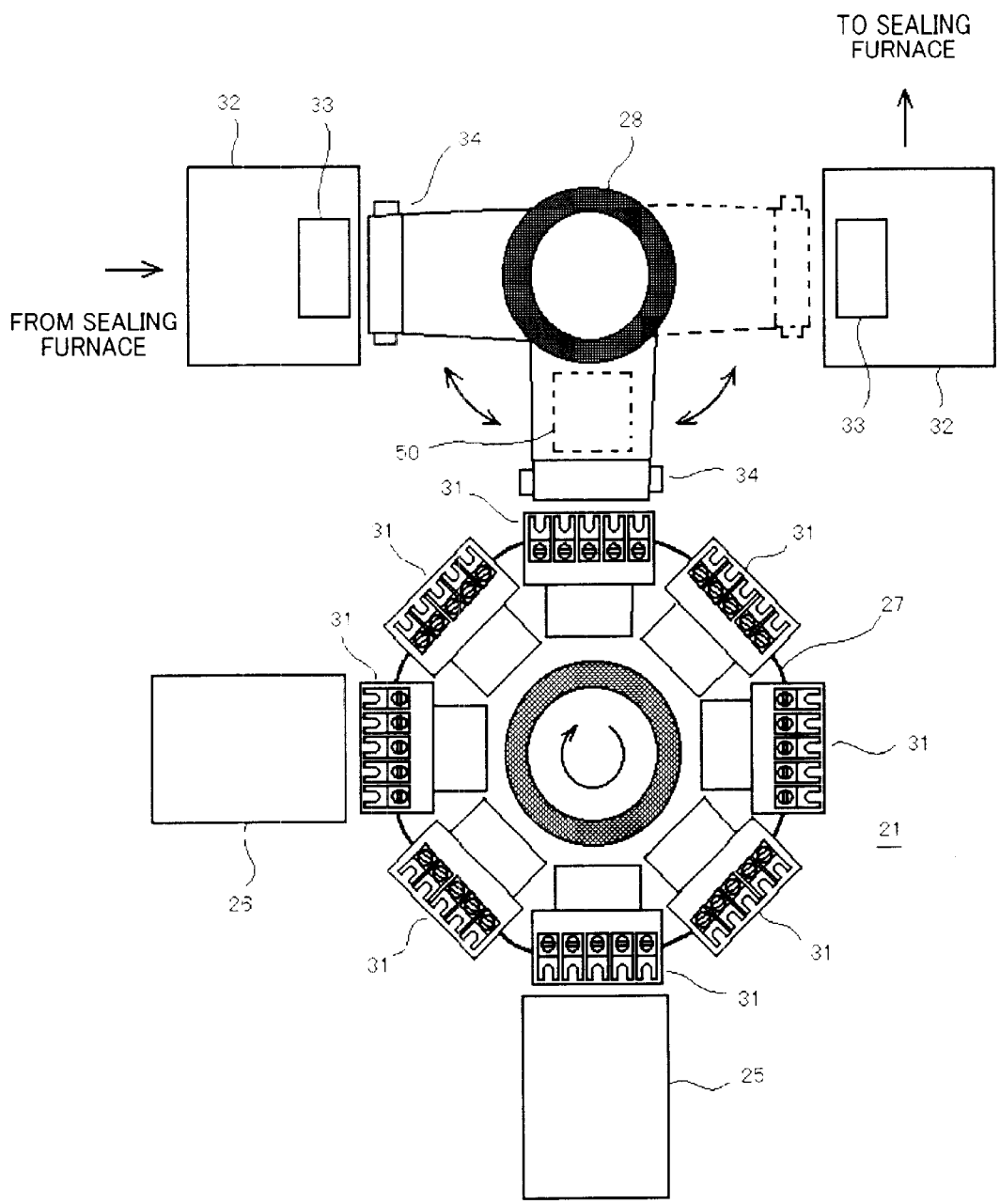
FIG. 3 is a plan view of a sealing machine of an embodiment of the present invention.

FIG. 3 is a plan view depicting the sealing machine 21 of the present embodiment viewed from the top. As FIG. 3 shows, the sealing machine 21 of the present embodiment comprises a package supply block 25 where the packages 81 shown in FIG. 13A in which the electronic device elements 80 are mounted are stored, a cap supply block 26 where caps 82 to be covers thereof are stored, a rotary table 27 having a cap loading stage 31 for loading the caps 82 onto the packages 81, and a clip transporting block 28 for unloading the packages 81 and the caps 82, which were superimposed on the rotary table 27, and transporting them to the sealing furnace 22.

The clip transporting block 28 further comprises two sets of clip chucks 34 which can hold the later-mentioned multi-clips 33, and the two sets of clip chucks 34 can swing as shown by the arrow marks in FIG. 3. As a result, when one clip chuck 34 transports one of the multi-clips 33 which has been returned from the outlet of the sealing furnace on the clip tray 32, to a position facing the cap loading stage 31, the other clip chuck 34 can align the other multi-clip 33 having been held at the position facing the cap loading stage 31 on the clip tray 32. The multi-clip 33 aligned on the clip tray 32 is transported to the inlet of the sealing furnace by the robot arm, which is not illustrated.

Figure 7:
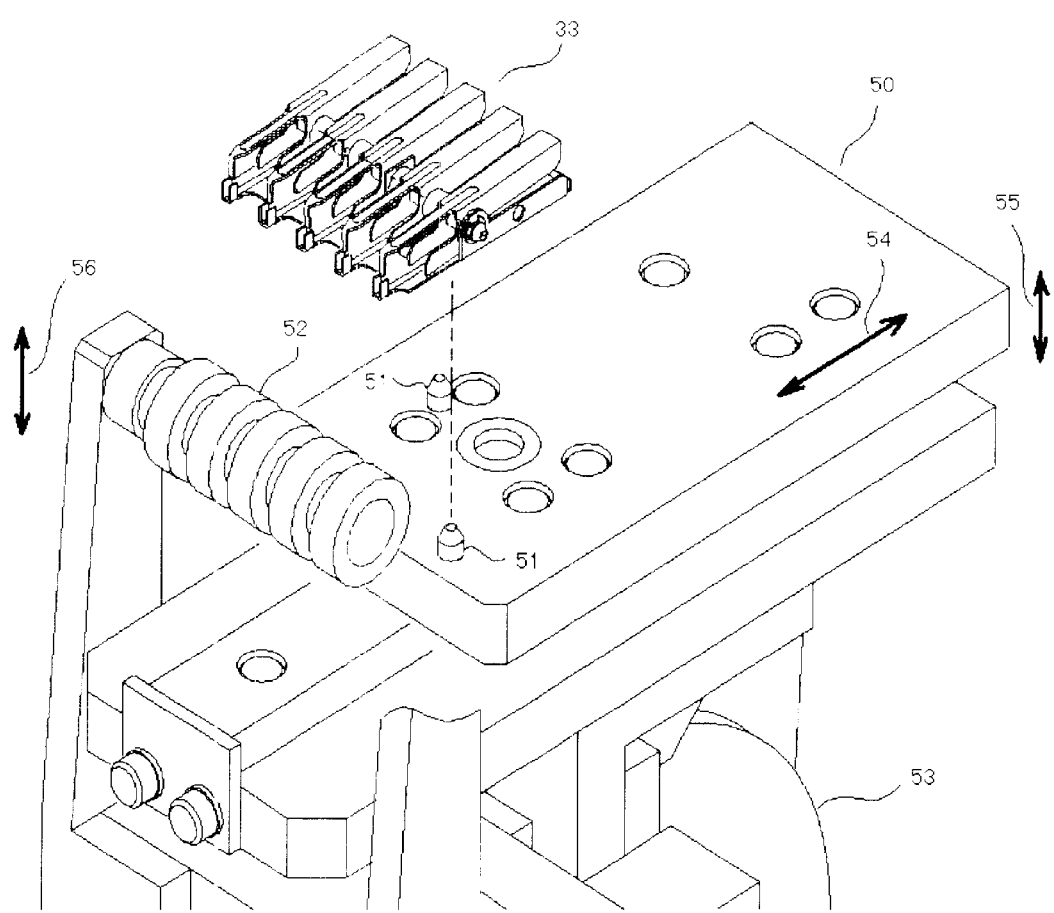
FIG. 7 is a perspective diagram depicting an operation of a clip stage.

In the clip transporting block 28, the clip stage 50, which will be described later with reference to FIG. 7, is installed. The clip transporting block 28 positions the clip stage 50 loaded with the multi-clip 33, at a position facing the cap loading stage 31, so that the multi-clip 33 can perform an open/close operation. Accordingly, the multi-clip 33 can hold and transport the plurality of sets of the packages and caps held by the cap loading stage 31.

In the rotary table 27, eight cap loading stages 31, which can hold five packages 81 and five caps 82 respectively, are installed at isometrical positions on the circumference shown in FIG. 3.

Figure 2:
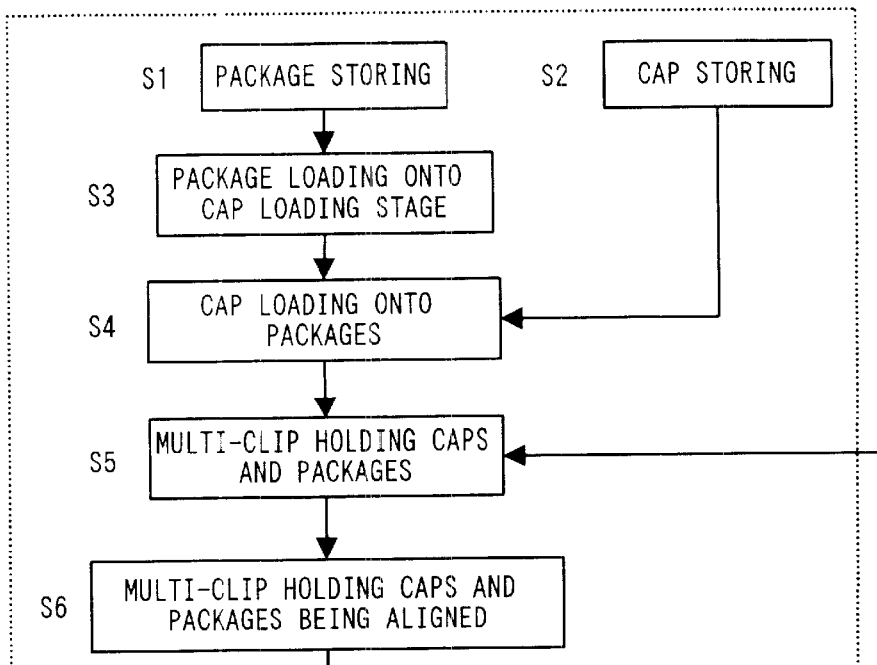
FIG. 2 is a processing flow chart of the sealing system of an embodiment of the present invention.

When the rotary table 27 rotates and one cap loading stage 31 comes to a position facing the package supply block 25 (the first rotational position), the packages 81 on which the electronic device elements 80 are mounted, are unloaded from the package supply block 25 as five packages in batch at a time, by a suction head, which is not illustrated, and are loaded onto the cap loading stage 31 (Step S3 in FIG. 2).

Figure 4:
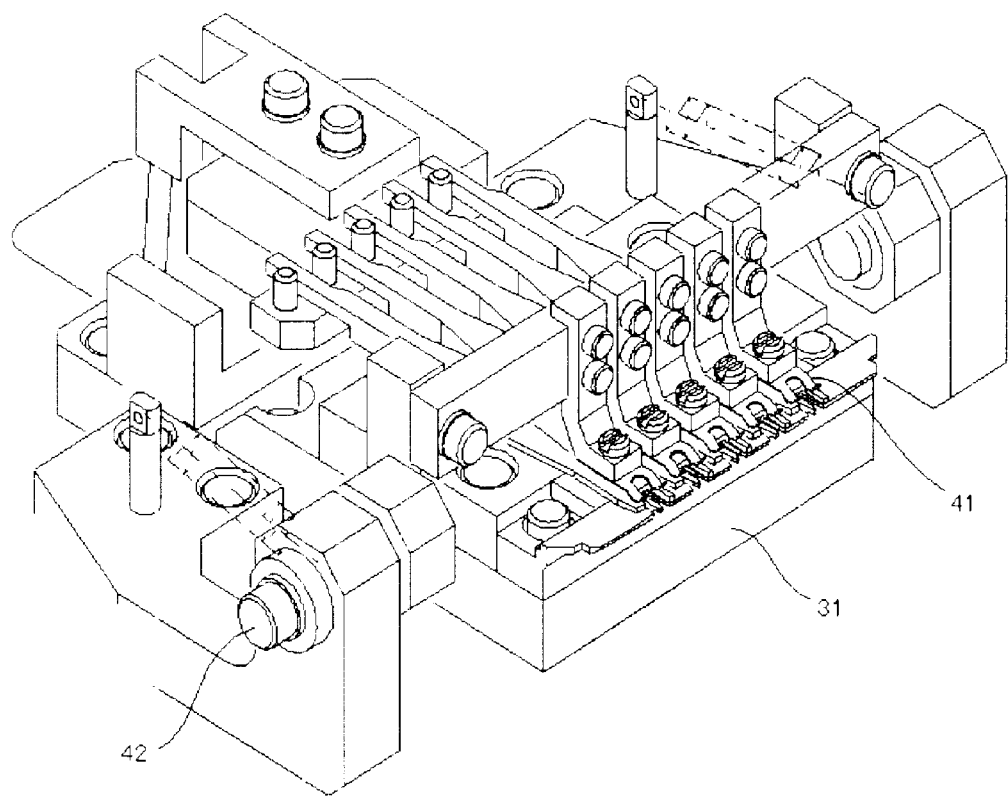
FIG. 4 is a perspective diagram depicting a general configuration of a cap loading stage.

FIG. 4 is a perspective diagram depicting a general configuration of the cap loading stage 31. The cap loading stage 31 comprises five sets of plate springs 41 which can be vertically driven, interlocking with the rotation of the rotary table 27, and the five sets of plate springs 41 rotate upward around the shaft 42 when the packages 81 are received from the package supply block 25, and rotate downward and press the packages 81 after the packages 81 are loaded. Therefore, the packages 81 are not dislocated even if the rotary table 27 rotates.

After the packages 81, on which the electronic device elements 80 are mounted, are loaded onto the cap loading stage 31, the rotary table 27 rotates 90° clockwise, as shown in FIG. 3, and the cap loading stage 31 comes to a position facing the cap supply block 26 (the second rotational position). At this position, the caps 82 are unloaded from the cap supply block 26 as five caps in batch at a time, by the suction head, and are loaded onto the packages 81 on the cap loading stage 31 (Step S4 in FIG. 2).

In this case too, the five sets of plate springs 41 rotate upward around the shaft 42 when the caps 82 are received from the cap supply block 26, and rotate downward and press the caps 82 after the caps 82 are received, so the packages 81 and caps 82 do not dislocate even if the rotary table 27 rotates.

After the caps 82 are superimposed on the packages 81, the rotary table 27 rotates another 90° clockwise, and the cap loading stage 31 comes to a position facing the clip transporting block 28 (the third rotational position).

In the clip transporting block 28, a multi-clip 33 removed from the sealed electronic devices 60 at the outlet of the sealing furnace 22, is returned by the return conveyer 24 on the clip tray 32, as shown in FIG. 3. The clip transporting block 28 unloads the packages 81 and the caps 82 from the cap loading stage 31 using the multi-clip 33 (Step S5 in FIG. 2), and aligns the multi-clip 33 holding the packages 81 and caps 82, on the clip tray 32 (Step S6 in FIG. 2). In actual operation, the rotary table rotates 45° each time. Therefore the same step for another cap loading stage 31 occurs while the cap loading stage is moving the first to the third rotational positions.

Figure 5:
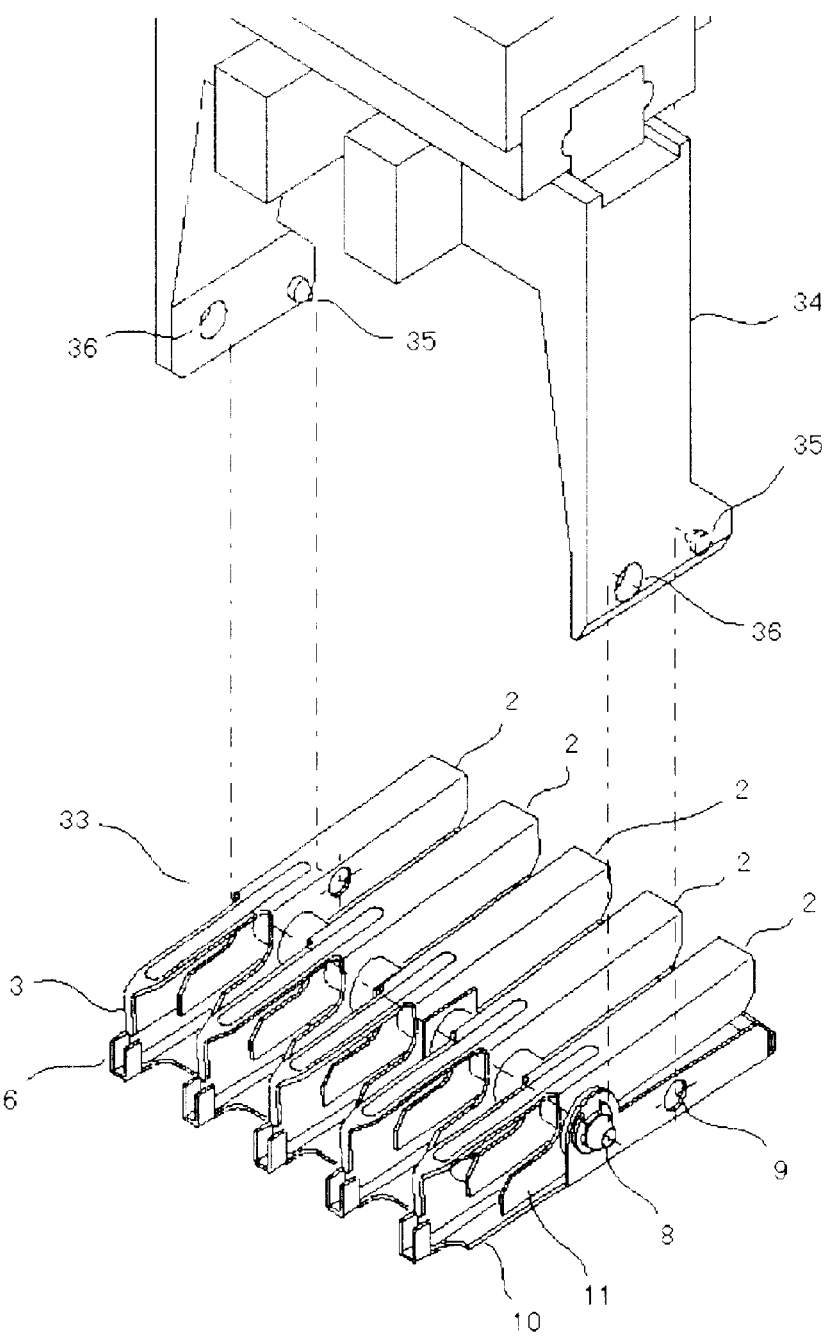
FIG. 5 is a perspective diagram depicting a general configuration of a clip chuck.

FIG. 5 is a perspective diagram depicting a general configuration of the clip chuck 34 which holds and transports the multi-clip 33 at the clip transporting block 28. As FIG. 5 shows, the multi-clip 33 comprises five sets of pressers 2 and a receiver 10 that can be opened/closed independently, and can hold five electronic devices 60 in batch using the tips 3 of the pressers and the tips 6 of the receiver.

The set shaft 8 to be the rotation center of the pressers 2 is chamfered so that both ends become tapered, and both chamfered ends extend out from the side faces of the multi-clip 33. There are holes 9 on the side faces of the receiver 10 of the multi-clip 33.

On the clip chuck 34, on the other hand, guide holes 36 to engage both ends of the set shaft 8 of the multi-clip 33 as well as pins 35 to be inserted into the holes 9 on the side faces of the receiver 10 of the multi-clip 33 are formed. Therefore, the multi-clip 33 can be held and transported by moving the clip chuck 34 vertically and controlling the length of the movement.

In this case, the tips of the set shaft 8 of the multi-clip 33 are chamfered so as to easily fit into the guide holes 36 of the clip chuck 34. The clip chuck 34 supports both side faces of the multi-clip 33 at two points, respectively, of one of the pins 35 and one of the guide holes 36, so the multi-clip 33 can be transported in a horizontal state.

Figure 6:
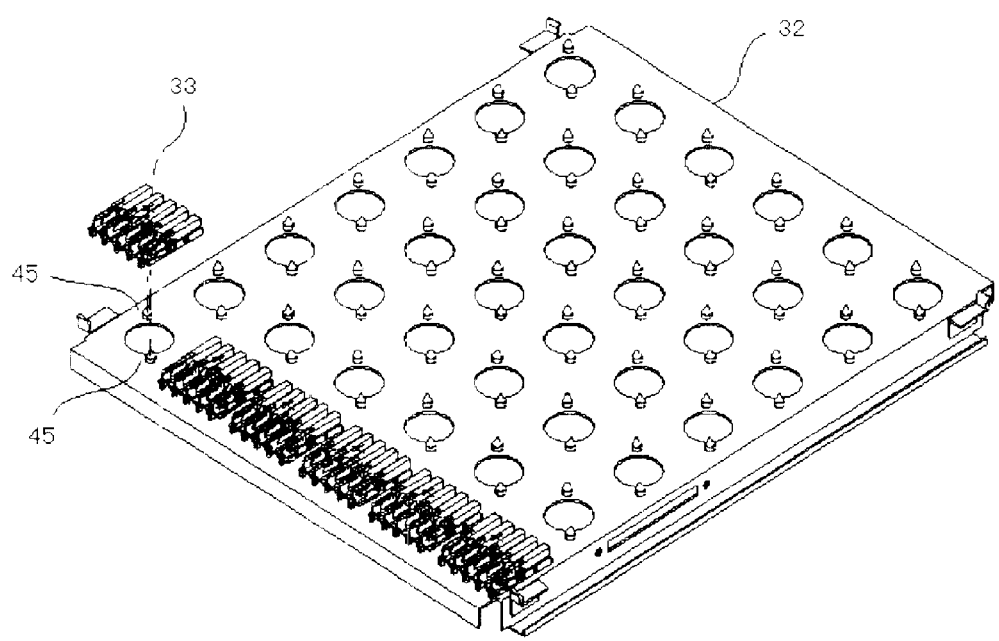
FIG. 6 is a perspective diagram depicting a general configuration of a clip tray.

FIG. 6 is a perspective diagram depicting a general configuration of the clip tray 32 for aligning the multi-clip 33. As FIG. 6 shows, pins 45 are arranged at a specific pitch on the clip tray 32, so the multi-clip 33 can be accurately aligned by inserting the pins (protrusions) 45 into the set holes which are formed on the base of the multi-clip 33.

In the clip transporting block 28, the multi-clip 33 holding the packages 81 and caps 82 is aligned on the clip tray 32, and the clip tray 32 is transported to the inlet of the sealing furnace 22 by a robot arm, which is not illustrated.

FIG. 7 is a perspective diagram depicting an operation of the clip stage 50 installed on the clip transporting block 28. The multi-clip 33 is held by the clip chuck 34, shown in FIG. 5, and is loaded onto the clip stage 50. In this case, the pins 51 on the top face of the clip stage 50 are inserted into the set holes which are formed on the base of the multi-clip 33, so the multi-clip 33 can be accurately positioned.

The clip stage 50 can be moved in the fore and aft directions shown by the arrow mark 54, and in the vertical direction shown by the arrow mark 55, as the driving force of the motor or the like, which is not illustrated, is transferred to the cam 53. The roller 52 can be moved in the vertical direction shown by the arrow mark 56, and the multi-clip 33 can be opened/closed by the roller 52 pushing down on the rear end of the multi-clip 33.

Figure 8:
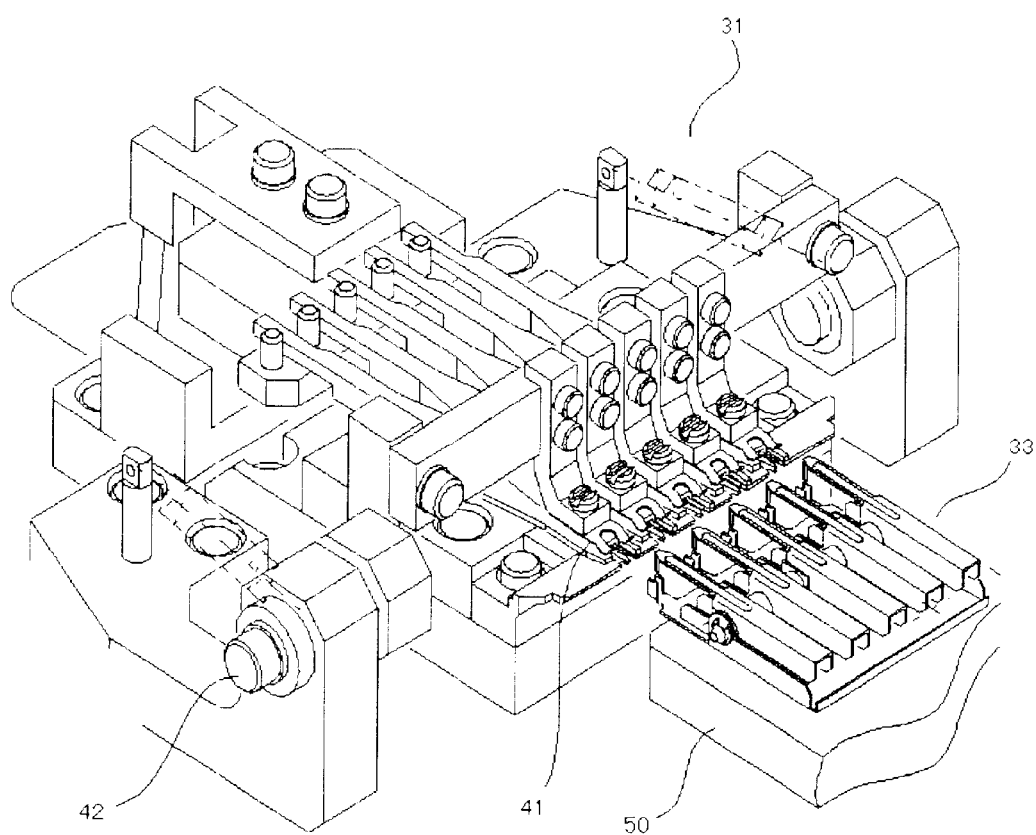
FIG. 8 is a perspective diagram depicting an operation of a clip stage.

FIG. 8 shows a state when the multi-clip 33 loaded on the clip stage 50 is positioned in front of the cap loading stage 31. In this state, the multi-clip 33 performs the fore and aft operation, the vertical operation, and the open/close operation, so as to unload the superimposed packages 81 and caps 82 on the cap loading stage 31.

Figure 9A:
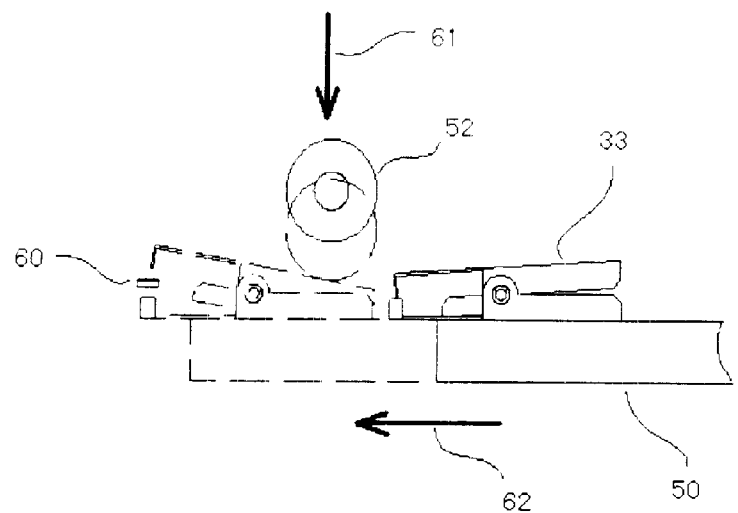
FIG. 9A is a diagram depicting an operation of a multi-clip.

FIGS. 9A and B are diagrams depicting an operation of the multi-clip 33 in this case. As FIG. 9A shows, the clip stage 50 on which the multi-clip 33 is loaded moves in the direction of the arrow mark 62, and the roller 52 is driven in the direction of the arrow mark 61, interlocking with the above movement. The roller 52 pushes down on the rear part of the multi-clip 33, and opens the multi-clip 33.

Figure 9B:
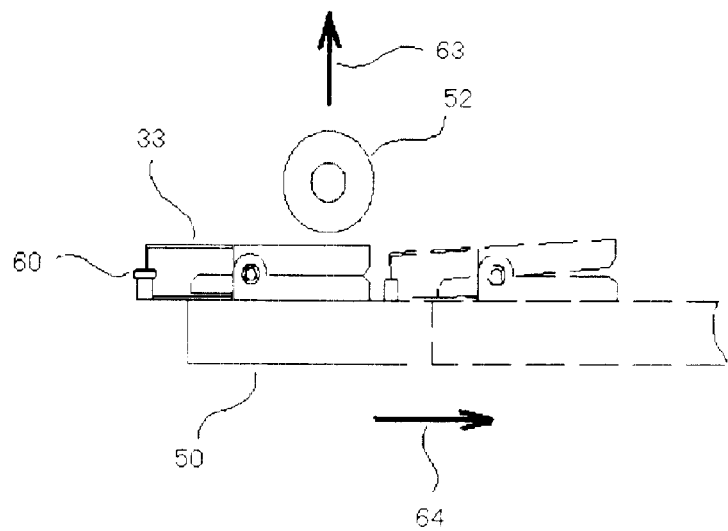
FIG. 9B is another diagram depicting an operation of a multi-clip.
Figure 10:
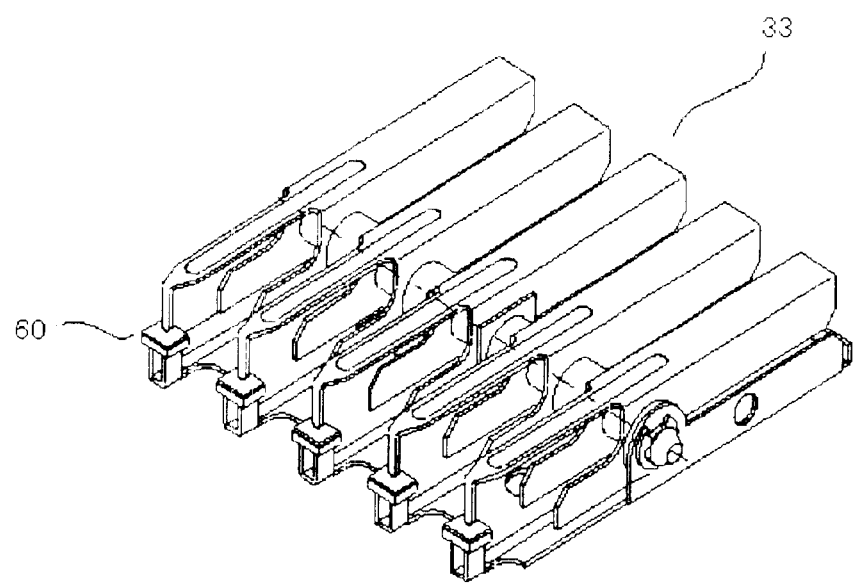
FIG. 10 is a perspective diagram showing an appearance of a multi-clip holding an electronic device.

Then as FIG. 9B shows, the roller 52 is driven vertically, as shown by the arrow mark 63, and the tips of the multi-clip 33 hold the electronic devices 60. Then the clip stage 50 moves in the direction of the arrow mark 64, and returns to the original position. FIG. 10 is a perspective diagram depicting the appearance of the multi-clip 33 which is holding the electronic devices 60.

In the clip transporting block 28, the packages 81 and the caps 82 are unloaded from the cap loading stage 31 in batch by the multi-clip 33 in this way, and the multi-clip 33 is aligned on the clip tray 32 by the clip chuck 34 (see FIG. 6).

The multi-clip 33 holding the packages 81 and caps 82 is aligned on the clip tray 32, and is transported to the sealing furnace 22 in this state by a robot arm, which is not illustrated, where the packages 81 and caps 82 are sealed (Step S7 in FIG. 2).

In the sealing furnace 22, the clip tray 32, where the multi-clips 33 are aligned, is heated while being transported by a belt, and the packages 81 and caps 82 are continuously sealed. Therefore by setting the setup temperature of the sealing furnace 22 and the transporting speed of the belt, the packages 81 and caps 82 can be sealed according to an arbitrarily chosen temperature profile, and the sealing quality can be improved. Considering a case when oxygen may act as a disturbing factor, such as in the case of gold-tin soldering, it is preferable that the inside of the sealing furnace 22 is maintained in a nitrogen atmosphere.

Figure 11:
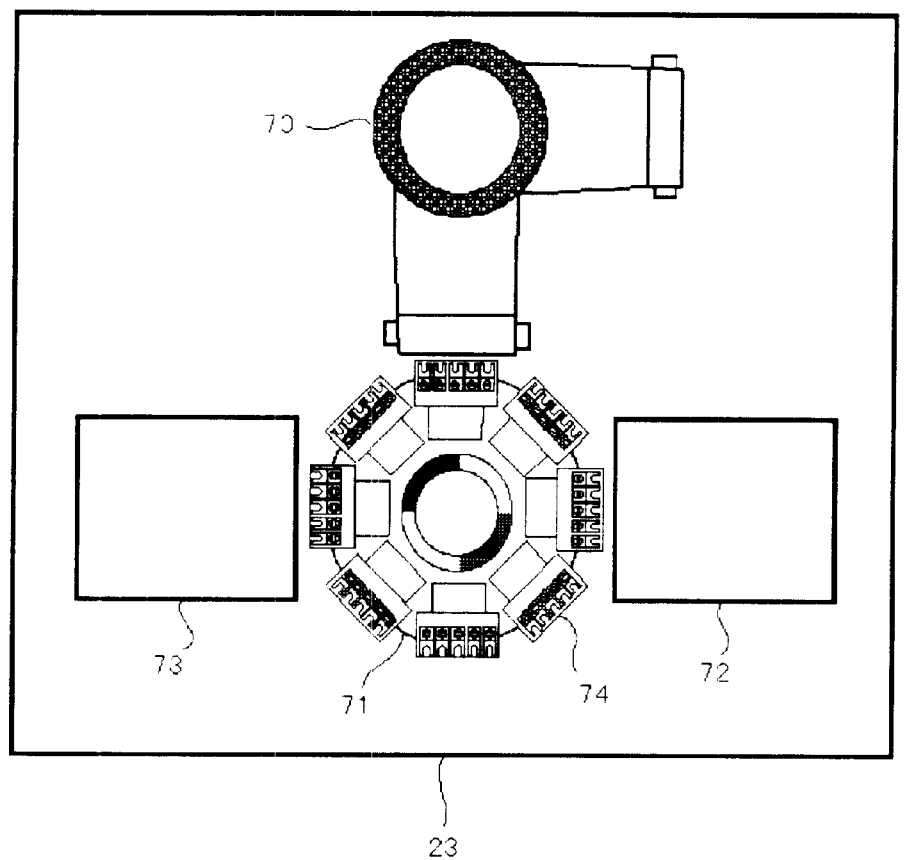
FIG. 11 is a diagram depicting a general configuration of a laser imprinting machine.

The sealed electronic devices 60, held by the multi-clip 33, are unloaded from the sealing furnace 22 in a state of being aligned on the clip tray 32, and are transported to the laser imprinting machine 23 in FIG. 1. FIG. 11 is a diagram depicting a general configuration of the laser imprinting machine 23.

The laser imprinting machine 23 comprises a clip transporting block 70 which unloads the multi-clip 33 holding the electronic devices 60 from the outlet of the sealing furnace 22 in FIG. 1, and removes the multi-clip 33 from the electronic devices 60, a rotary table 71 for holding the electronic devices 60 by the device holding stage 74, a laser head block 72 for imprinting onto the electronic devices by laser, and a device unloading block 73 for storing the electronic devices 60 after laser imprinting.

On the clip transporting block 70 of the laser imprinting machine 23, the clip chuck 34 (see FIG. 5) and the clip stage 50 (see FIG. 7) are installed in the same way as the clip transporting block 28 of the sealing machine 21 in FIG. 1. The multi-clip 33 holding the electronic devices 60 is unloaded from the outlet of the sealing furnace 22 by the clip chuck 34, and is loaded onto the clip stage 50 (Step S8 in FIG. 2).

In the clip stage 50 of the laser imprinting machine 23, the electronic devices 60 are removed from the multi-clip 33 holding the electronic devices 60, and are transported to the device holding stage 74 of the rotary table 71 (Step S9 in FIG. 2).

The multi-clip 33, from which the electronic devices 60 are removed, on the other hand, is aligned on the clip tray 32 by the clip chuck 34, and is returned to the inlet of the sealing furnace 22 by the return conveyer 24 in FIG. 1 (Step S10 in FIG. 2).

The electronic devices 60 loaded on the device holding stage 74 are imprinted by the laser head block 72 (Step S11 in FIG. 2), and are stored in the device unloading block 73 (Step S12 in FIG. 2).

According to the sealing system of the present embodiment, a plurality of sets of packages and caps held by the multi-clip in batch are heated and sealed, so the sealing efficiency of the packages and caps can be improved.

Also in the sealing furnace, an optimum temperature profile for solder melting can be used, so thermal stress on the packages can be decreased, and the air tightness quality of the electronic devices can be improved.

Figure 12A:
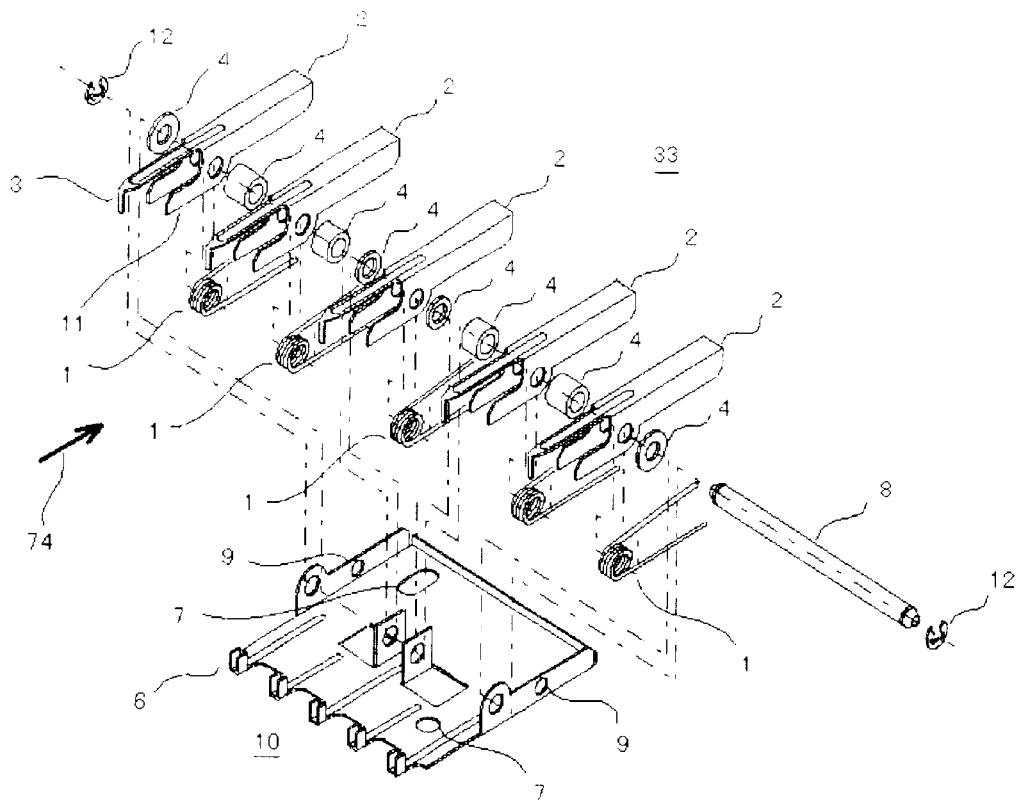
FIG. 12A is an exploded perspective view depicting a configuration of a multi-clip.

The multi-clip 33 to be used for the sealing system of the present embodiment will now be described in detail. FIG. 12A is an exploded perspective view depicting a configuration of the multi-clip 33. As FIG. 12A shows, the multi-clip 33 comprises five pressers 2 which can be opened/closed independently, and a receiver 10, and each presser 2 is rotatably attached to the set shaft 8. The set shaft 8 is secured on the side faces of the receiver 10 by the pins 12.

Forces are applied to the pressers 2 and the receiver 10 independently by a specific spring pressure of the coil springs 1, which is an example of an elastic body according to the present invention. Therefore an arbitrary spring pressure can be set by changing the wire diameter, angle and the number of turns of the coil spring 1, and an independent rotational driving force can be applied to the pressers. Hereupon, it is to be noted that various elastic bodies including other types of springs can be used as an elastic body according to the present invention.

Figure 12B:
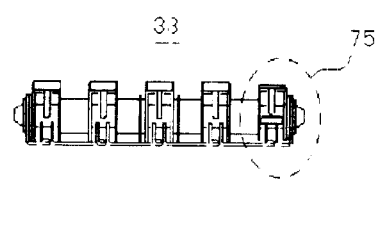
FIG. 12B is a view showing part of the configuration of a multi-clip in FIG. 12A.
Figure 12C:
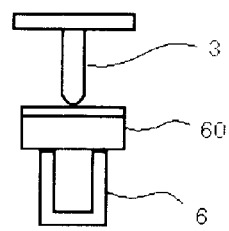
FIG. 12C is another view showing part of the configuration of a multi-clip in FIG. 12A.

The tips 3 of the pressers of the multi-clip 33 are processed such that the portions which contact the electronic devices 60 become thinner, as shown in FIG. 12B, which is the view when the multi-clip 33 is viewed from the arrow mark 76 direction in FIG. 12A, and in FIG. 12C, which is an enlarged view of the area circled by the dotted line portion 75 of FIG. 12B.

The spaces between the five pressers 2 of the multi-clip 33 are set by spacer rings 4 at high dimensional accuracy, so as FIG. 12C shows, the tips 3 of the pressers contact the electronic devices 60 at the centers of the tips 6 of the receiver. Therefore, load can be uniformly applied to the electronic devices 60 by means of the tips 3 of the pressers and tips 6 of the receiver, and the caps 82 and the packages 81 can be uniformly sealed.

The plurality of tips 6 of the receiver are machined to be the same height from the base of the receiver 10, so as to hold the five electronic devices 60 horizontally. Therefore the electronic devices 60, held horizontally, can be heated in the sealing furnace 22, and the caps 82 and packages 81 can be uniformly sealed by keeping the temperature conditions of the electronic devices 60 uniform.

As FIG. 12A shows, the stoppers 11 for restricting the rotational angle of the pressers are set to the pressers 2, so the tips 3 of the pressers do not become lower than a specific height as shown in FIG. 12B, even if the pressers are not holding the electronic devices 60. This is to prevent the tips 3 of the pressers from colliding with the rotary table 27 when the pressers 2, not holding the electronic devices 60, approach the rotary table 27, or to prevent the tips 3 of the pressers from rubbing against the surface of the rotary table 27 when the pressers 2, not holding the electronic devices 60, move away from the rotary table 27.

As FIG. 12A shows, set holes 7 are formed in the receiver 10 for inserting the pins 45 (see FIG. 6) on the clip tray 32 when the multi-clip 33 is aligned on the clip tray 32.

Because of this, the multi-clip 33 can be aligned on the clip tray 32 accurately. Also when the multi-clip 33 is loaded onto the clip stage 50, the pins 51 on the clip stage 50 are inserted into the set holes 7, therefore the loading position of the multi-clip 33 can be accurate.

Figure 12D:
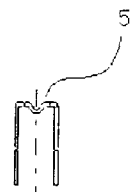
FIG. 12D is another view showing part of the configuration of a multi-clip in FIG. 12A.

The plate thickness of the multi-clip 33 is extremely thin so that the heat capacity of the multi-clip 33 is minimized. For this, a rib structure 5 having a convex, concave, or other cross-sectional shape is created on the top faces of the pressers 2, as FIG. 12D shows, so that the strength of the multi-clip 33 is maintained and warping and deformation are prevented.

According to the present embodiment, a plurality of sets of the packages and caps can be held in batch by the multi-clip, and the plurality of sets of the packages and caps which are held in batch are heated and sealed, so the sealing efficiency of the packages and caps can be improved. It is to be noted that in the case of the sealing system of the present embodiment, the processing speed per one electronic device was improved, from 4.5 sec./unit to 1.3 sec./unit, compared with a conventional system.

The scope of protection of the present invention is not restricted by the above embodiment, but covers the invention stated in the claims and equivalents thereof.

According to the present invention, a plurality of sets of the packages and caps held in batch by the multi-clip are heated and sealed, so the sealing efficiency of the packages and caps can be improved.

Also in the sealing furnace, an optimum temperature profile for solder melting can be used, so the thermal stress on the packages can be decreased, and the air tightness of the electronic devices can be improved.

Also the multi-clip can be accurately aligned on the clip tray by inserting the protrusions on the clip tray into the set holes formed at the multi-clip, so the temperature conditions in the sealing furnace can be uniform, and the air tightness of the electronic devices can be improved.

Also even when the multi-clip is not holding the packages and caps, the tips of the pressers do not become lower than a specific height, so a collision of the tips of the pressers with the cap loading stage can be prevented even if the multi-clip not holding the packages and caps approaches the cap loading stage.

Also the rib structure maintains the strength of the multi-clip and prevents warping and deformation, which allows the plate thickness of the multi-clip to be thin, so the heat capacity of the multi-clip can be decreased and the heat loss in the sealing furnace can be decreased.

What is claimed is:

1. A sealing system comprising:
    a sealing machine for superimposing a pre-soldered cap onto the opening of a package on which an electronic device element is mounted;
    a multi-clip for receiving and holding a plurality of sets of the packages and caps superimposed by said sealing machine in batch; and
    a sealing furnace for heating the plurality of sets of said packages and caps held in batch by said multi-clip and generating a plurality of electronic devices in batch by melting said previously applied solder and sealing the plurality of sets of said packages and caps, wherein
    said multi-clip comprises a plurality of pressers each capable of moving independently.

2. The sealing system according to claim 1, wherein said sealing machine comprises:
    a package supply block for storing a plurality of said packages;
    a cap supply block for storing a plurality of said caps;
    a cap loading stage for superimposing said caps supplied from said cap supply block onto the openings of said packages supplied from said package supply block; and
    a clip transporting block for transporting the plurality of sets of said packages and caps held in batch by said multi-clip to said sealing furnace.

3. The sealing system according to claim 2, wherein said sealing machine further comprises a rotary table on which a plurality of said cap loading stages are set, and in each of said cap loading stages, said packages are supplied at a first rotational position of said rotary table, said caps are supplied at a second rotational position of said rotary table, and the plurality of sets of said superimposed packages and caps are supplied to said clip transporting block at a third rotational position of said rotary table.

4. The sealing system according to claim 2, further comprising a clip tray on which a plurality of said multi-clips can be aligned, and said clip transporting block aligns the multi-clips holding said plurality of sets of packages and caps on said clip tray and transports the multi-clips to said sealing furnace.

5. The sealing system according to claim 4, wherein said clip tray has a plurality of protrusions for aligning said multi-clips, and said multi-clip has set holes where said protrusions are to be inserted.

6. The sealing system according to claim 2, wherein said clip transporting block comprises a clip stage on which said multi-clip is loaded, and a cam mechanism for moving said clip stage horizontally and vertically, and operating said multi-clip loaded on said clip stage to open/close.

7. The sealing system according to claim 1, further comprising a laser imprinting machine for removing said multi-clip from said electronic devices which were sealed in said sealing furnace and imprinting said electronic devices by laser.

8. The sealing system according to claim 7, further comprising a return conveyer for transporting said multi-clip removed at said laser imprinting machine to said sealing machine.

9. A clip for holding superimposed packages and caps in a sealing system, comprising:
    a receiver that can contact a plurality of sets of said superimposed packages and caps on a same plane;
    a shaft secured to said receiver;
    a plurality of pressers which can rotate around said shaft; and
    an elastic body which applies an independent rotational driving force to said plurality of pressers, wherein said receiver and said plurality of pressers can hold the plurality of sets of said superimposed packages and caps independently by said independent rotational driving force, wherein
    said each of said pressers is capable of moving independently.

10. A clip for holding superimposed packages and caps in a sealing system, comprising:
    a receiver that can contact a plurality of sets of said superimposed packages and caps on a same plane;
    a shaft secured to said receiver;
    a plurality of pressers which can rotate around said shaft; and
    an elastic body which applies an independent rotational driving force to said plurality of pressers, wherein said receiver and said plurality of pressers can hold the plurality of sets of said superimposed packages and caps independently by said independent rotational driving force, said clip
    further comprising stoppers which are attached to said pressers for restricting the rotational angle of said pressers.

11. A clip for holding superimposed packages and caps in a sealing system, comprising:
    a receiver that can contact a plurality of sets of said superimposed packages and caps on a same plane;
    a shaft secured to said receiver;
    a plurality of pressers which can rotate around said shaft; and
    an elastic body which applies an independent rotational driving force to said plurality of pressers, wherein said receiver and said plurality of pressers can hold the plurality of sets of said superimposed packages and caps independently by said independent rotational driving force, said clip
    further comprising spacer rings which are attached to said shaft so as to arrange said plurality of pressers at a specific space.

12. The clip according to claim 9, wherein said pressers are made of a thin plate with a rib structure.

13. A sealing method for superimposing a pre-soldered cap onto the opening of a package on which an electronic device element is mounted and sealing said package and said cap by melting said previously applied solder, comprising steps of:
    superimposing said package and said cap;
    holding a plurality of sets of said superimposed packages and caps in batch; and
    sealing the plurality of sets of said packages and caps held in batch by heating at a specific temperature profile, wherein
    said holding step includes a multi-clip comprising a plurality of pressers each capable of moving independently.

* * * * *